United States Patent

Sato

[11] Patent Number: 5,841,319
[45] Date of Patent: Nov. 24, 1998

[54] METHOD AND APPARATUS FOR CONTROLLING GAIN OF AN AMPLIFIER BY COMPARING A DETECTED OUTPUT ENVELOPE AND A REFERENCE SIGNAL

[75] Inventor: Hideaki Sato, Saitama, Japan

[73] Assignee: Sony Corporation, Tokyo, Japan

[21] Appl. No.: 785,791

[22] Filed: Jan. 21, 1997

[30] Foreign Application Priority Data

Jan. 24, 1996 [JP] Japan .................................... 8-030005

[51] Int. Cl.[6] ................................................. H03G 3/20
[52] U.S. Cl. ........................................... 330/129; 330/140
[58] Field of Search .................................. 330/129, 140, 330/141, 279, 281

[56] References Cited

U.S. PATENT DOCUMENTS

| 5,214,393 | 5/1993 | Aihara ...................................... 330/279 |
| 5,319,804 | 6/1994 | Matsumoto et al. ................. 330/129 X |
| 5,509,011 | 4/1996 | Birth ......................................... 370/77 |

FOREIGN PATENT DOCUMENTS 0434294 6/1991 European Pat. Off. .

OTHER PUBLICATIONS

T. Noguchi et al., "Modulation Techniques for Microwave Digital Radio", IEEE Communications Magazine, vol. 24, No. 10, pp. 21–30 (Oct. 1986).

*Primary Examiner*—Steven Mottola
*Attorney, Agent, or Firm*—Jay H. Maioli

[57] ABSTRACT

An envelope level of an output of a variable gain power amplifier is detected by a detector. An envelope level of an output of the variable gain power amplifier detected by the detector and a waveform of a reference signal which is generated from a reference signal generator are compared. A gain of the variable gain power amplifier is controlled in accordance with a comparison output. Upon leading of a transmission output, the reference signal is raised from a grounding level to a rest value of the detector or more and is maintained at a value higher than the rest value of the detector. After the reference signal enters a response range of a negative feedback loop, it is smoothly raised along a cosine square wave. Upon trailing of the transmission output, the reference signal is smoothly reduced to a value near the rest value of the detector along a cosine square wave and is maintained at a value near the rest value of the detector. After the negative feedback loop does not respond, the reference signal is reduced to the rest value of the detector or less.

20 Claims, 6 Drawing Sheets

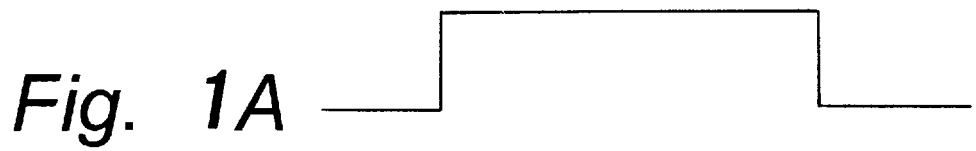
Fig. 1A
Fig. 1B
Fig. 2 (PRIOR ART)
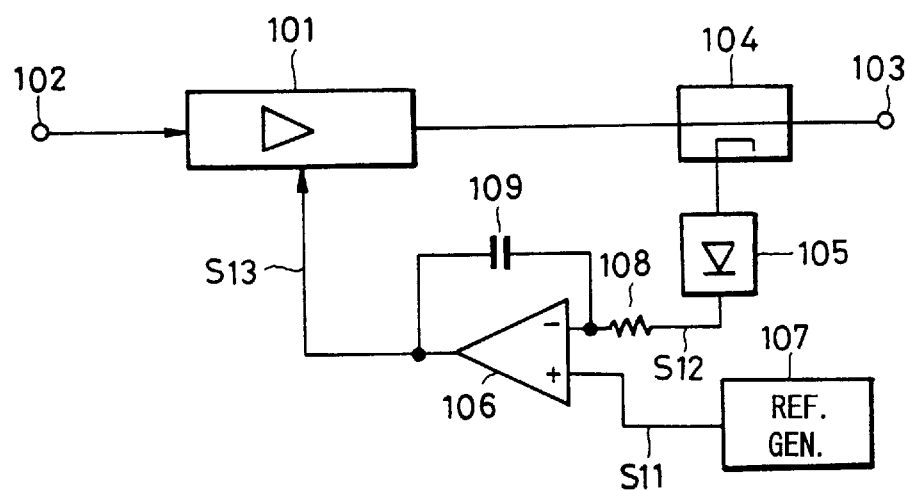
Fig. 3

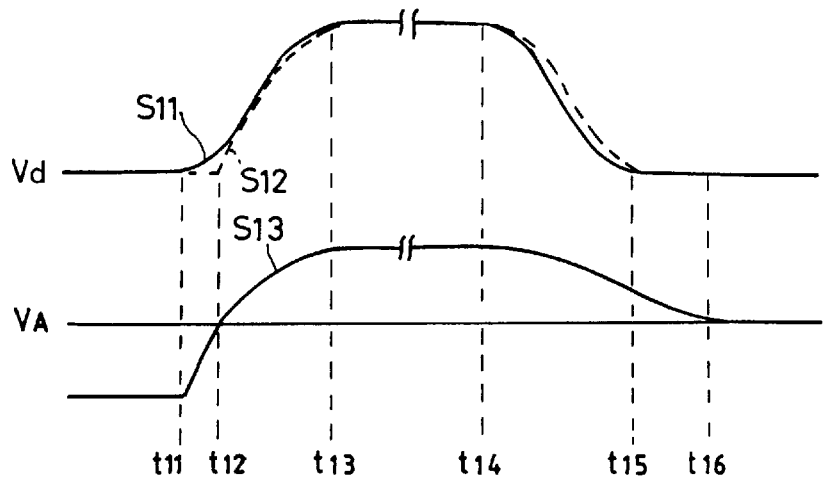
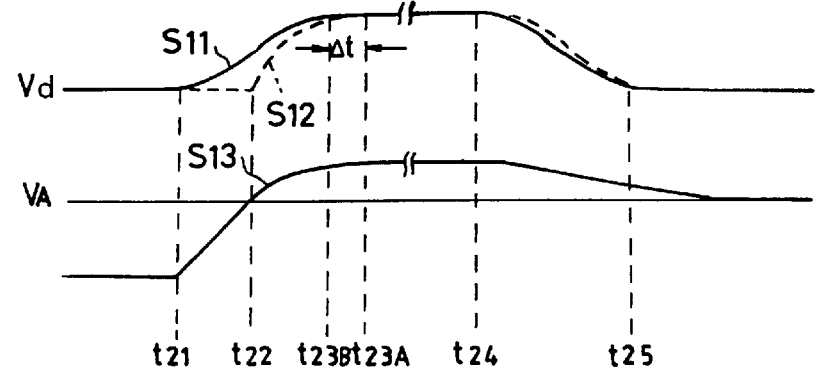

Fig. 7
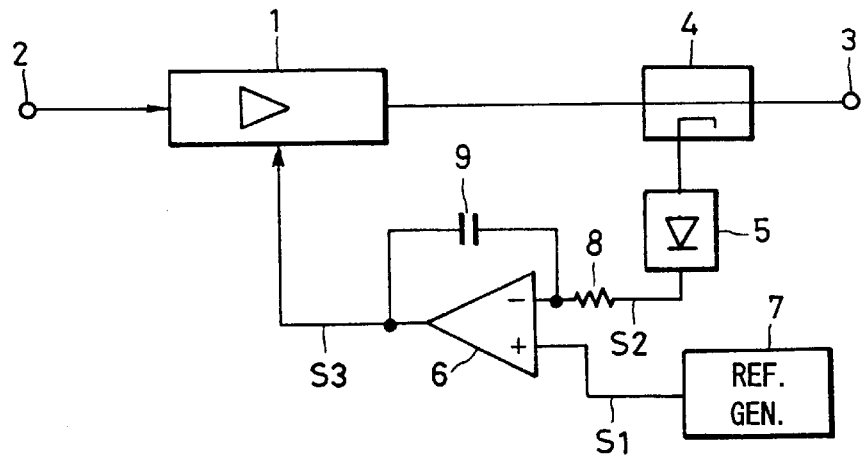
Fig. 8
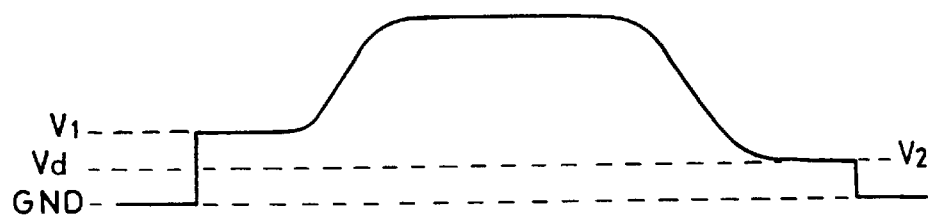
Fig. 9A
Fig. 9B
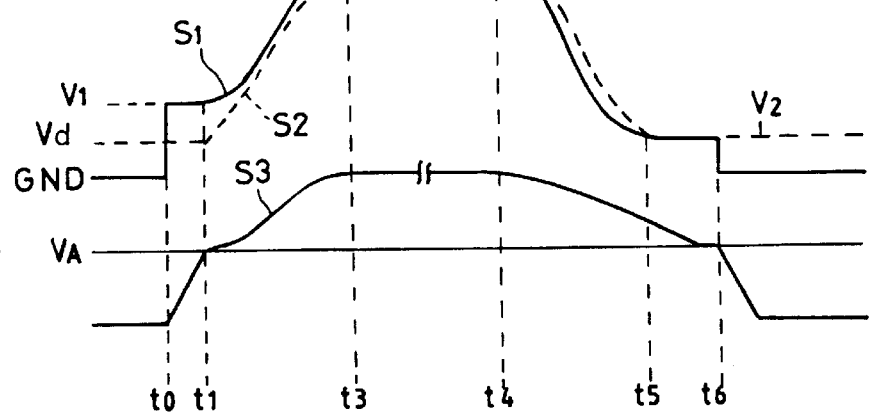

METHOD AND APPARATUS FOR CONTROLLING GAIN OF AN AMPLIFIER BY COMPARING A DETECTED OUTPUT ENVELOPE AND A REFERENCE SIGNAL

BACKGROUND OF THE INVENTION

1. Field of the Invention

The invention relates to a power amplifying circuit and method suitable for use in the power amplification of a digital cellular phone terminal of a time-division multiplex system.

2. Description of the Prior Art

In a manner similar to a GSM (Group Special Mobile) system, since a transmission is performed in a burst manner in a digital cellular phone using the time-division multiplex system, if leading and trailing (ramp-up and ramp-down) edges of a transmission signal are not smoothly performed upon transmission, a transmission signal spectrum is spread, so that a neighboring channel is obstructed. That is, as shown in FIG. 1A, when the leading and trailing edges of the transmission signal are steep, an envelope of the transmission signal becomes a square wave. Therefore, the spectrum is spread and an influence is exerted on the neighboring channel. As shown in FIG. 1B, a control is performed so that the leading and trailing edges of the transmission signal become gentle.

The control to make the leading and trailing edges of the transmission signal gentle is realized by a negative feedback loop such that an output level of a variable gain power amplifier is detected, the output level of the variable gain power amplifier is compared with, for example, a cosine square waveform, and a gain of the variable gain power amplifier is controlled in accordance with a comparison output. FIG. 2 shows an example of a conventional power amplifying circuit in which the leading and trailing edges of the transmission signal are controlled so as to be gentle.

In FIG. 2, reference numeral 101 denotes a variable gain power amplifier. The variable gain power amplifier 101 power amplifies a transmission output in a digital cellular phone terminal of, for example, the GSM system. A gain of the variable gain power amplifier 101 can be controlled by a control signal from an operational amplifier 106.

The transmission signal is supplied from an input terminal 102 to the variable gain power amplifier 101. Since the time-division multiplex system is used in the digital cellular phone of the GSM system, the transmission signal is sent in a burst manner. The transmission signal is power amplified by the variable gain power amplifier 101 and is outputted from an output terminal 103.

The output of the variable gain power amplifier 101 is transmitted through a directional coupler 104 and is detected by a detector 105. The detector 105 envelope detects the output of the variable gain power amplifier 101. An output of the detector 105 is supplied to one input terminal of the operational amplifier 106. A reference signal from a reference signal generator 107 is supplied to the other input terminal of the operational amplifier 106. A resistor 108 and a capacitor 109 are provided for the operational amplifier 106 so that integration characteristics are added thereto. The reference signal generator 107 generates a reference signal of a cosine square waveform as shown in FIG. 3 so that an envelope level of the transmission output from the variable gain power amplifier 101 is smoothly changed along, for example, a cosine square waveform.

An envelope level S12 of the output of the variable gain power amplifier 101 from the detector 105 and a reference signal S11 from the reference signal generator 107 are compared by the operational amplifier 106. A control signal S13 is formed by the comparison output. The gain of the variable gain power amplifier 101 is controlled by the control signal S13. By having the negative feedback loop as mentioned above, the leading and trailing edges of the output of the variable gain power amplifier 101 are controlled so as to form, for example, a cosine square curve. Consequently, the leading and trailing edges at the time of the transmission become gentle and it is possible to prevent an obstruction of the neighboring channel due to the spread spectrum upon burst transmission.

For instance, in the GSM system, a leakage power of a non-transmission time slot has to be suppressed to a value lower than an electric power of a transmission time slot by about 70 dB. On the other hand, a dynamic range of the detector 105 is equal to about 30 dB and cannot cover a power variable range of the variable gain power amplifier 101. Consequently, even when a signal with the cosine square waveform as shown in FIG. 3 is used as a reference signal, the transmission output is not changed like a reference signal. Namely, the transmission output changes by an open loop at the start time of the transmission signal. When the transmission output lies within a control range of the negative feedback loop, it changes along the reference signal. Thus, a problem results such that a discontinuity occurs in the transmission output and the spectrum is spread and a variation also occurs in the time when a maximum output is derived. Since the dynamic range of the detector 105 cannot cover the variable range of the leakage power of the non-transmission time slot and the electric power of the transmission time slot, the leakage power cannot be controlled to a sufficiently low level when a timing enters the non-transmission time slot.

FIGS. 4A and 4B represent waveforms in the sections when they are controlled by using the reference signal as shown in FIG. 3 in the conventional power amplifier shown in FIG. 2. In FIG. 4A, the output S12 of the detector 105 is a rest voltage $V_d$ before a time point $t_{11}$.

At the start of the transmission, the reference signal S11 gradually rises from the time point $t_{11}$. Just after the time point $t_{11}$, since the transmission output lies within the dynamic range of the detector 105, as shown in FIG. 4B, the control signal S13 from the operational amplifier 106 rises in accordance with a time constant which is decided by the resistor 108 and capacitor 109. Consequently, the output of the variable gain power amplifier 101 gradually rises. However, the control system forms an open loop until the output level of the variable gain power amplifier 101 enters the dynamic range of the detector 105. As shown in FIG. 4A, the output level S12 of the detector 105 is equal to the rest voltage $V_d$ for a period of time from $t_{11}$ to $t_{12}$.

When the control signal S13 from the operational amplifier 106 rises to a level $V_A$ at the time point $t_{12}$, the output level of the variable gain power amplifier 101 enters the dynamic range of the detector 105. Since the output level of the variable gain power amplifier 101 enters the dynamic range of the detector 105 from the time point $t_2$, the output S12 corresponding to the envelope level of the output of the variable gain power amplifier 101 is generated from the detector 105. The control signal S13 is formed by the comparison output of the envelope level S12 and reference signal S11, so that a negative feedback loop is made operative. The output level of the variable gain power amplifier 101 changes in accordance with the reference signal by the negative feedback loop.

As mentioned above, hitherto, the control system forms the open loop just after the time point $t_{11}$, at the start of the transmission and the negative feedback loop is made operative from the time point $t_{12}$. Therefore, a discontinuity occurs in the transmission output near the time point $t_{12}$.

As shown in FIG. 4A, when the transmission is finished, the reference signal S11 is reduced at a time point $t_{14}$ along, for example, a cosine square curve. When the reference signal S11 is reduced along, for example, the cosine square curve, since the negative feedback loop operates, the output level of the variable gain power amplifier 101 decreases in accordance with a change in reference signal S11. The level of the reference signal S11 is set to the rest voltage $V_d$ of the detector 105 at a time point $t_{15}$.

At this time, although the output level S12 of the detector 105 is set to the rest voltage $V_d$, the dynamic range of the detector 105 doesn't cover the range of the leakage power of the non-transmission time slot and the electric power of the transmission time slot, so that the leakage power at the time of the non-transmission is not always sufficiently reduced. That is, although it is desired to reduce the leakage power of the non-transmission time slot to a value which is lower than the electric power of the transmission time slot by about 70 dB, the dynamic range of the detector 105 is equal to about 30 dB. Therefore, since the control to reduce the leakage power of the non-transmission time slot to the value which is lower than the electric power of the transmission time slot by about 70 dB exceeds a range of the system control, whether the leakage power at the time of the non-transmission has sufficiently been reduced cannot be assured.

Hitherto, when the power level is low, a variation occurs in the time until the maximum output is derived.

FIGS. 5A and 5B show a case where the transmission power level is low. As shown in FIGS. 5A and 5B, when the transmission power level is low, there is a long period of time (time points $t_{21}$ to $t_{22}$) until the output level of the variable gain power amplifier 101 enters the dynamic range of the detector 105 at the start of the transmission. Consequently, time point $t_{23A}$ which represents when the output power reaches the maximum value is delayed as compared with a time point $t_{23B}$ when the reference signal reaches the maximum value. As mentioned above, hitherto, a variation occurs in the time until the output power becomes maximum. Namely, a delay time $\Delta t$ when the output power becomes maximum is varied due to the output power.

For example, as disclosed in JP-A-3-289805, there has been proposed an apparatus constructed in a manner such that a rectangular wave pulse is prepared by using a construction shown in FIG. 6, the rectangular wave pulse is superimposed to the control signal S13 to be sent to the variable gain power amplifier at the time of the transmission, and the lack of the dynamic range of the detector is compensated by the rectangular wave pulse. With this construction, however, since the rectangular wave pulse is newly needed, a circuit scale increases.

As shown in JP-A-7-15267 and JP-A-4-355507, an apparatus having an auxiliary negative feedback loop for interpolating a time interval until the negative feedback loop starts to respond has been provided. However, when such an auxiliary loop is provided, a circuit scale increases.

OBJECTS AND SUMMARY OF THE INVENTION

It is an object of the invention to provide a power amplifying circuit which smoothes leading and trailing edges of a transmission output and can prevent a spread of a spectrum.

Another object of the invention is to provide a power amplifying circuit which can control a leakage power at a non-transmission time slot to a small enough value.

Still another object of the invention is to provide a power amplifying circuit which can prevent a variation of a delay time when the output power becomes maximum due to an output power.

Further another object of the invention is to provide a power amplifying circuit which accomplishes the above-mentioned objects without causing an increase in circuit scale.

According to the invention, there is provided a power amplifying circuit comprising: a variable gain power amplifier; a detector for detecting an envelope level of an output of the variable gain power amplifier; a reference signal generator for generating a reference signal to convert an envelope of the output of the variable gain power amplifier to a smooth waveform; and a negative feedback loop for comparing the envelope level of the output of the variable gain power amplifier detected by the detector and a waveform of the reference signal which is generated from the reference signal generator, thereby controlling a gain of the variable gain power amplifier in accordance with a comparison output, wherein the waveform of the reference signal from the reference signal generator is raised from a value lower than a rest value of the detector to a value higher than the rest value of the detector upon leading of a transmission output and is maintained to a value higher than the rest value of the detector and, after that, the reference signal is smoothly raised.

According to the invention, there is provided a power amplifying circuit comprising: a variable gain power amplifier; a detector for detecting an envelope level of an output of the variable gain power amplifier; a reference signal generator for generating a reference signal to convert an envelope of the output of the variable gain power amplifier to a smooth waveform; and a negative feedback loop for comparing the envelope level of the output of the variable gain power amplifier detected by the detector and a waveform of the reference signal which is generated from the reference signal generator, thereby controlling a gain of the variable gain power amplifier in accordance with a comparison output, wherein the waveform of the reference signal from the reference signal generator is smoothly reduced to a value near a rest value of the detector upon trailing of a transmission output and is maintained to a value near the rest value of the detector and, after that, the reference signal is reduced to the rest value of the detector or less.

When the transmission output rises, the reference signal is raised from the ground level to the rest value of the detector or more and is maintained to a value higher than the rest value of the detector. After the transmission output enters a response range of the negative feedback loop, the reference signal is smoothly raised along a cosine square wave. When the transmission output trails, the reference signal is smoothly reduced to a value near the rest value of the detector along the cosine square wave and is maintained at the value near the rest value of the detector. After the negative feedback loop does not respond, the reference signal is reduced to the rest value of the detector or less. By using the reference signal, a discontinuity of the transmission level upon leading of the transmission output is extinguished and the generation of a spurious result can be prevented. At the start of the transmission, there is no variation in the time until the maximum power is derived. Further, a leakage power in a non-transmission slot can be sufficiently reduced.

The above and other objects and features of the present invention will become apparent from the following detailed description and the appended claims with reference to the accompanying drawings.

BRIEF DESCRIPTION OF THE DRAWINGS

FIGS. 1A and 1B are waveform diagrams which are used for explanation of a conventional power amplifying circuit;

FIG. 2 is a block diagram of an example of the conventional power amplifying circuit;

FIG. 3 is a waveform diagram of a reference signal of a cosine square waveform;

FIGS. 4A and 4B are control waveform diagrams which are used for explanation of the example of the conventional power amplifying circuit;

FIGS. 5A and 5B are control waveform diagrams in case of a low power level which are used for explanation of the example of the conventional power amplifying circuit;

FIG. 7 is a block diagram of an example of a power amplifying circuit to which the invention is applied;

FIG. 8 is a waveform diagram of a reference signal which is used for explanation of the example of the power amplifying circuit to which the invention is applied;

FIGS. 9A and 9B are waveform diagrams which are used for explanation of the example of the power amplifying circuit to which the invention is applied;

DETAILED DESCRIPTION OF THE PREFERRED EMBODIMENT

Figure 6:
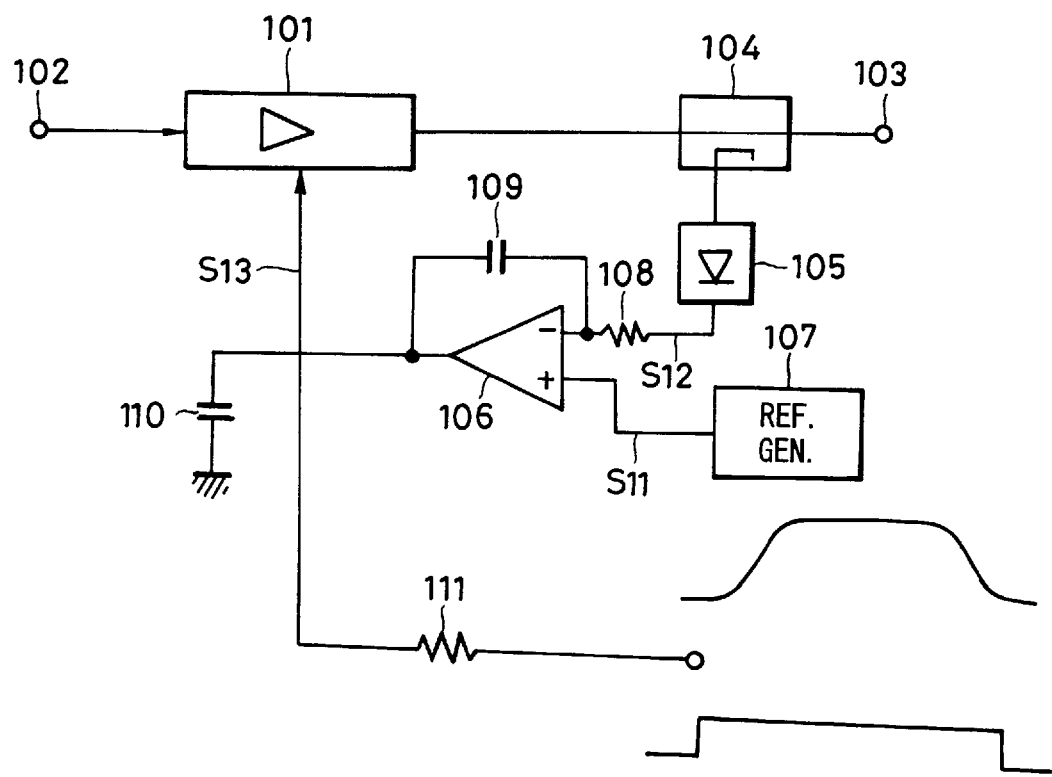
FIG. 6 is a block diagram of another example of a conventional power amplifying circuit.

An embodiment of the invention will now be described hereinbelow with reference to the drawings. FIG. 7 shows an embodiment of the invention.

In FIG. 7, reference numeral 1 denotes a variable gain power amplifier. The variable gain power amplifier 1 power amplifies a transmission output in, for example, a digital cellular phone terminal of a GSM system. A gain of the variable gain power amplifier 1 can be controlled by a control signal from an operational amplifier 6.

A transmission signal is supplied from an input terminal 2 to the variable gain power amplifier 1. In the digital cellular phone of the GSM system, since a time-division multiplex system is used, the transmission signal is sent in a burst-like manner. The transmission signal is power amplified by the variable gain power amplifier 1 and is outputted from an output terminal 3.

An output of the variable gain power amplifier 1 is detected by a detector 5 through a directional coupler 4. The detector 5 detects an envelope of the output of the variable gain power amplifier 1. An output of the detector 5 is supplied to one input terminal of the operational amplifier 6. A reference signal from a reference signal generator 7 is supplied to the other input terminal of the operational amplifier 6. A resistor 8 and a capacitor 9 are provided for the operational amplifier 6, thereby adding integrating characteristics.

The reference signal generator 7 generates the reference signal so that an envelope level of the transmission output from the variable gain power amplifier 1 smoothly changes along, for example, a cosine square waveform. The reference signal from the reference signal generator 7 rises from a grounding level to a rest voltage or more of the detector 5 at the time of the leading of the transmission output so that the envelope level of the output signal can be controlled within a response range of a negative feedback loop. The reference signal is maintained at a value higher than the rest voltage of the detector 5. After the reference signal rises to a value that is equal to or larger than the detector rest value and enters a response range of the negative feedback loop, it is smoothly allowed to rise along a cosine square wave. At the time of trailing of the transmission output, the reference signal is allowed to smoothly drop by a cosine square wave to a level near the rest voltage of the detector and is maintained at a level near the rest voltage of the detector 5. After a response of the negative feedback loop is extinguished, the reference signal is trailed to the grounding level.

Namely, FIG. 8 shows an example of the reference signal from the reference signal generator 7. As shown in FIG. 8, upon leading, the reference signal is raised from the grounding level to a level V1 higher than the rest voltage Vd of the detector 5 and is maintained at the level V1. After that, it is gradually raised along a cosine square curve. Upon trailing, the reference signal is gradually dropped along a cosine square curve and is reduced to a level V2 that is almost equal to the rest voltage of the detector 5 and is maintained at the level V2. When the response of the negative feedback loop is extinguished, the reference signal is dropped to the grounding level.

An envelope output level S2 of the output of the variable gain power amplifier 1 from the detector 5 and a reference signal S1 from the reference signal generator 7 are compared by the operational amplifier 6. A control signal S3 is formed by a comparison output. The gain of the variable gain power amplifier 1 is controlled by the control signal S3. By using a negative feedback loop, the leading edge and trailing edge of the envelope level of the output of the variable gain power amplifier 1 are controlled to, for example, a cosine square curve. Thus, the leading edge and trailing edge upon transmission become smooth and an interference of the adjacent channel due to a spread spectrum at the time of the burst transmission can be prevented.

According to the embodiment of the invention, the reference signal as shown in FIG. 8 is used. By using such a reference signal, a discontinuity of the transmission level at the leading edge of the transmission output is extinguished and the generation of a spurious result can be prevented. At the time of the start of the transmission, a variation in time until the maximum power is derived is eliminated. Further, a leakage power in the non-transmission slot can be sufficiently reduced.

Namely, in FIG. 9A, the level of the reference signal S1 is set to the grounding level before a time point t0. In this instance, the output level S2 of the detector 5 is equal to the rest voltage Vd.

When the transmission is started, the reference signal S1 rises to the level V1 from the grounding level at the time point t0. The level V1 is higher than the rest voltage Vd of the output of the detector 5. Therefore, as shown in FIG. 9B, the level S3 of the control voltage from the operational amplifier 6 rises in accordance with a time constant which is determined by the resistor 8 and capacitor 9. Until the output level of the variable gain power amplifier 1 enters a dynamic range of the detector 5, the control system is in an open loop state. As shown in FIG. 9A, the output level S2 of the detector 5 is set to the rest voltage Vd for a period of time from t0 to t1. The control system is held in the open loop state until the time point t1.

When the level S3 of the control voltage from the operational amplifier 6 rises to the level $V_A$ at the time point t1, the output level of the variable gain power amplifier 1 enters the dynamic range of the detector 5. As shown in FIG. 9A, the waveform of the reference signal S1 rises along the cosine square curve from the time point t1. The output level S2 according to the envelope level of the output of the variable gain power amplifier 1 is derived from the detector 5. The control signal S3 is formed by a comparison output between the envelope level S2 and reference signal S1 and the negative feedback loop operates. By using a negative feedback loop, after the time point t1, the output level of the variable gain power amplifier 1 changes in accordance with the reference signal S1.

According to the embodiment of the invention as mentioned above, since the reference signal S1 is maintained at a level that is equal to or higher than the rest voltage Vd of the detector 5 for a period of time from t0 to t1, the negative feedback loop is immediately made operative from the time point t1. Therefore, a large discontinuity doesn't occur in the transmission output and the generation of the spurious result can be prevented. Since the negative feedback loop is immediately made operative from the time point t1, even when the transmission power is low, a delay of the timing at which the transmission output becomes maximum doesn't occur.

When the transmission is finished, as shown in FIG. 9A, the reference signal S1 is reduced along, for example, a cosine square curve at a time point t4. When the reference signal S1 is dropped along, for instance, the cosine square curve, the control signal S3 is formed by a comparison output between the envelope level S2 of the detector 5 and the reference signal S1 and the negative feedback loop operates. Therefore, the output level of the variable gain power amplifier 1 decreases in accordance with a change in the reference signal.

The level S1 of the reference signal is maintained to the rest voltage Vd for a period of time from t5 to t6. Thus, as shown in FIG. 9B, the level of the control signal S3 from the operational amplifier 6 drops to $V_A$. As shown in FIG. 9A, the reference signal S1 is reduced to the grounding level at the time point t6. When the reference signal S1 decreases to the rest voltage Vd or less, the control system enters the open loop state. As shown in FIG. 9B, the level S3 of the control voltage from the operational amplifier 6 decreases in accordance with the time constant which is determined by the resistor 8 and capacitor 9. The output of the variable gain power amplifier 1 also decreases.

According to the embodiment of the invention as mentioned above, when the transmission is finished, after the reference signal is maintained to a level near the rest voltage Vd, if the negative feedback loop doesn't respond, the reference signal is reduced to the grounding level. Therefore, the output power in the non-transmission slot can be sufficiently reduced.

According to the embodiment of the invention as mentioned above, the reference signal S1 is raised from the grounding level to a level that is equal to or larger than the rest value of the detector at the time of leading of the transmission output. After the reference signal enters the response range of the negative feedback loop, it is smoothly raised along the cosine square wave. At the time of the trailing of the transmission output, the reference signal is smoothly reduced to a level near the rest value of the detector along a cosine square wave and is maintained at a level near the rest value of the detector. After the negative feedback loop does not respond, the reference signal is dropped to the grounding level.

Figure 10:
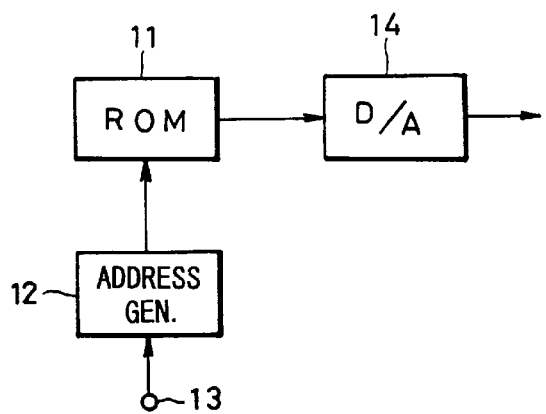
FIG. 10 is a block diagram of an example of a reference signal generator in the power amplifying circuit to which the invention is applied.

The reference signal generator 7 for generating the reference signal as mentioned above can be constructed, for example, as shown in FIG. 10. In FIG. 10, data to generate the reference signal as shown in FIG. 8 has been stored in a ROM 11. When a transmission control signal is supplied to a terminal 13, an address is generated from an address generating circuit 12 and the data of the reference signal is read out from the ROM 11. The data of the reference signal is converted into an analog signal by a D/A converter 14 and is outputted.

Figure 11A:
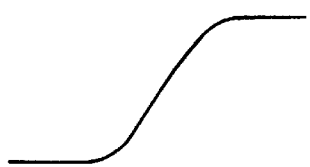
FIGS. 11A, 11B, and 11C are leading waveform diagrams which are used for explanation of the reference signal generator in the power amplifying circuit to which the invention is applied.
Figure 12A:
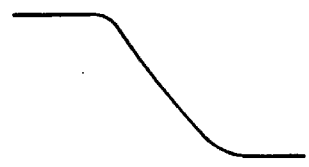
FIGS. 12A, 12B, and 12C are trailing waveform diagrams which are used for explanation of the reference signal generator in the power amplifying circuit to which the invention is applied.
Figure 11B:
Figure 12B:
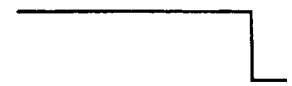
Figure 11C:
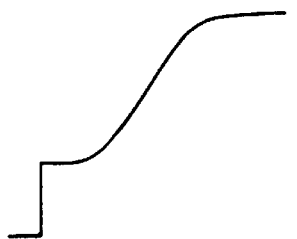
Figure 12C:
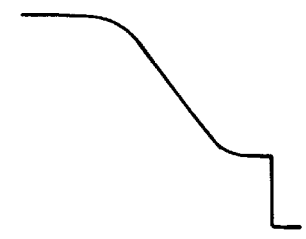
Figure 13:
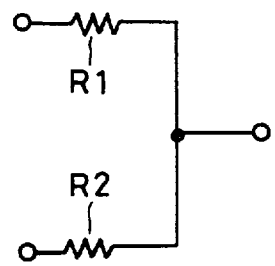
FIG. 13 is a connection diagram of a resistor synthesizing circuit which is used for explanation of the reference signal generator in the power amplifying circuit to which the invention is applied.

The reference signal which is generated from such a reference signal generator can be also formed by adding a cosine square waveform and a rectangular wave in an analog or digital manner. Namely, upon leading, a waveform which rises along a cosine square waveform as shown in FIG. 11A and a waveform which rises as shown in FIG. 11B are prepared. Upon trailing, a waveform which trails along a cosine square waveform as shown in FIG. 12A and a waveform which trails as shown in FIG. 12B are prepared. By using a synthesizing circuit comprising resistors R1 and R2 as shown in FIG. 13, upon leading, a waveform which rises along a cosine square waveform as shown in FIG. 11A and a waveform which rises as shown in FIG. 11B are added. Thus, a leading waveform of the reference signal as shown in FIG. 11C can be obtained. Upon trailing, a waveform which trails along a cosine square waveform as shown in FIG. 12A and a waveform which trails as shown in FIG. 12B are added. Thus, a trailing waveform of the reference signal as shown in FIG. 12C can be obtained.

Figure 14A:
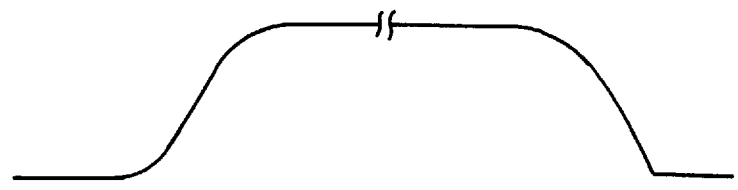
FIGS. 14A, 14B, and 14C are leading and trailing waveform diagrams which are used for explanation of the reference signal generator in the power amplifying circuit to which the invention is applied.
Figure 14B:
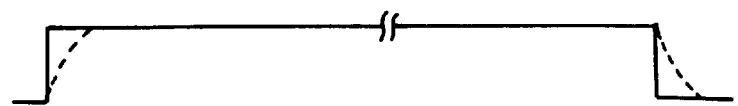
Figure 14C:
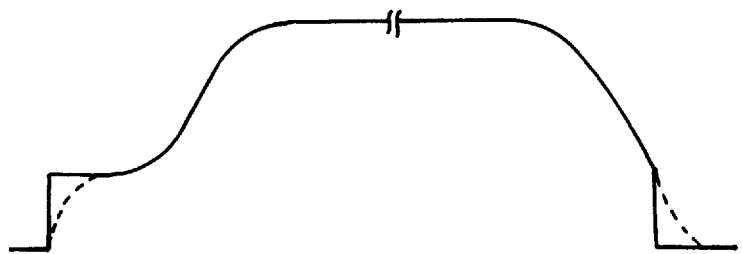

When the control of the leading edge and the control of the trailing edge are simultaneously executed, a waveform which rises along a cosine square waveform and trails along a cosine square wave as shown in FIG. 14A and a rectangular wave as shown in FIG. 14B are prepared. By adding the waveform as shown in FIG. 14A and the waveform as shown in FIG. 14B, a leading waveform of the reference signal as shown in FIG. 14C can be obtained. It is also possible to construct a waveform as shown by a broken line in FIG. 14B, so that after the rectangular wave is integrated, it is added and a waveform as shown by a broken line in FIG. 14C is derived.

According to the invention, upon leading of the transmission output, the reference signal is raised from the grounding level to the rest value of the detector or more and is maintained at a value higher than the rest value of the detector. After the reference signal enters the response range of the negative feedback loop, it is smoothly raised along the cosine square wave. Upon trailing of the transmission output, the reference signal is smoothly dropped to a value near the rest value of the detector along the cosine square wave and is maintained at a value near the rest value of the detector. After the negative feedback loop does not respond, the reference signal is reduced to the rest value of the detector or less. By using such a reference signal, a discontinuity of the transmission level at the leading edge of the transmission output doesn't occur and the generation of the spurious result can be prevented. When the transmission is started, a variation in time until the maximum power is derived doesn't occur. Further, a leakage power in the non-transmission slot can be sufficiently reduced.

Although the preferred embodiments of the present invention have been described above, the invention is not limited to the foregoing embodiments but many modifications and variations are possible within the spirit and scope of the appended claims of the invention.

What is claimed is:

1. A power amplifying circuit comprising:
    a variable gain power amplifier receiving a transmission signal and producing a transmission output;
    a detector for detecting an envelope level of an output of said variable gain power amplifier;
    a reference signal generator for generating a reference signal to convert the envelope level of the output of said variable gain power amplifier to a smooth waveform; and
    a negative feedback loop including means for comparing the envelope level of the output of said variable gain power amplifier detected by said detector with a waveform of the reference signal from said reference signal generator, thereby producing a control signal for controlling a gain of said variable gain power amplifier in accordance with a comparison output,
    wherein a level of the reference signal from said reference signal generator is raised from a value lower than a rest value of said detector to a value higher than said rest value of said detector at a leading edge of the transmission output and is maintained at the value higher than the rest value of said detector and subsequently said level of the reference signal is smoothly raised.

2. The circuit according to claim 1, wherein a waveform of said reference signal which is smoothly raised is a cosine square waveform.

3. A power amplifying circuit comprising:
    a variable gain power amplifier receiving a transmission signal and producing a transmission output;
    a detector for detecting an envelope level of an output of said variable gain power amplifier;
    a reference signal generator for generating a reference signal to convert the envelope level of the output of said variable gain power amplifier to a smooth waveform; and
    a negative feedback loop including means for comparing the envelope level of the output of said variable gain power amplifier detected by said detector with a waveform of the reference signal from said reference signal generator, thereby producing a control signal for controlling a gain of said variable gain power amplifier in accordance with a comparison output,
    wherein a level of the reference signal from said reference signal generator is smoothly reduced to a value near a rest value of said detector at a trailing edge of the transmission output and is maintained at the value near the rest value of said detector and subsequently said level of the reference signal is reduced to the rest value of said detector or less.

4. The circuit according to claim 3, wherein a waveform of said reference signal which is smoothly reduced is a cosine square waveform.

5. A power amplifying method comprising the step of:
    detecting an envelope level of an output of a variable gain power amplifier using a detector;
    generating a reference signal to convert the envelope level of the output of said variable gain power amplifier to a smooth waveform using a reference signal generator;
    comparing the envelope level of the output of said variable gain power amplifier detected by said detector with a waveform of the reference signal from said reference signal generator, thereby controlling a gain of said variable gain power amplifier in accordance with a comparison output; and
    raising a level of the reference signal from said reference signal generator from a value lower than a rest value of said detector to a value higher than the rest value of said detector at a leading edge of a transmission output from said variable gain power amplifier, maintaining said level at the value higher than the rest value of said detector and subsequently smoothly raising said level of the reference signal.

6. The method according claim 5, wherein a waveform of said reference signal which is smoothly raised is a cosine square waveform.

7. A power amplifying method comprising the steps of:
    detecting and envelope level of a output of a variable gain power amplifier using a detector;
    generating a reference signal to convert the envelope level of the output of said variable gain power amplifier to a smooth waveform using a reference signal generator;
    comparing the envelope level of the output of said variable gain power amplifier detected by said detector with a waveform of the reference signal from said reference signal generator, thereby controlling a gain of said variable gain power amplifier in accordance with a comparison output; and
    smoothly reducing a level of the reference signal from said reference signal generator to a value near a rest value of said detector at a trailing edge of a transmission output from said variable gain power amplifier, maintaining said level at the value near the rest value of said detector and subsequently reducing said level of the reference signal to rest value of said detector or less.

8. The method according to claim 7, wherein a waveform of said reference signal which is smoothly reduced is a cosine square waveform.

9. A power amplifying circuit comprising:
    a variable gain power amplifier receiving a transmission signal and producing a transmission output;
    a detector for detecting an envelope level of an output of said variable gain power amplifier;
    a reference signal generator including an address generator receiving a transmission control signal for addressing a read only memory and a digital to analog convertor for converting an output of said read only memory for generating a reference signal to convert the envelope level of the output of said variable gain power amplifier to a smooth waveform; and
    a negative feedback loop including means for comparing the envelope level of the output of said variable gain power amplifier detected by said detector with a waveform of the reference signal from said reference signal generator, thereby producing a control signal for controlling a gain of said variable gain power amplifier in accordance with a comparison output, wherein a level of the reference signal from said reference signal generator is raised from a value lower than a rest value of said detector to a value higher than said rest value of said detector at a leading edge of the transmission output and is maintained at the value higher than the rest value of said detector, for a period of time during which said negative feedback loop operates and subsequently said level of the reference signal is smoothly raised.

10. The circuit according to claim 9, wherein a waveform of said reference signal which is smoothly raised is a cosine square waveform.

11. A power amplifying circuit comprising:

a variable gain power amplifier receiving a transmission signal and producing a transmission output;

a detector for detecting an envelope level of an output of said variable gain power amplifier;

a reference signal generator for generating a reference signal to convert the envelope level of the output of said variable gain power amplifier to a smooth waveform; and a negative feedback loop including means for comparing the envelope level of the output of said variable gain power amplifier detected by said detector with a waveform of the reference signal from said reference signal generator, thereby producing a control signal for controlling a gain of said variable gain power amplifier in accordance with a comparison output, wherein a level of the reference signal from said reference signal generator is smoothly reduced to a value near a rest value of said detector at a trailing edge of the transmission output and is maintained at the value near the rest value of said detector for a period of time during which said negative feedback loop operates and subsequently said level of the reference signal is reduced to the rest value of said detector or less.

12. The circuit according to claim 11, wherein a waveform of said reference signal which is smoothly reduced is a cosine square waveform.

13. A power amplifying method comprising the steps of:

detecting an envelope level of an output of a variable gain power amplifier using a detector;

generating a reference signal to convert the envelope level of the output of said variable gain power amplifier to a smooth waveform using a reference signal generator;

comparing the envelope level of the output of said variable gain power amplifier detected by said detector with a waveform of the reference signal from said reference signal generator, thereby controlling a gain of said variable gain power amplifier in accordance with a comparison output; and raising a level of the reference signal from said reference signal generator from a value lower than a rest value of said detector to a value higher than the rest value of said detector at a leading edge of a transmission output from said variable gain power amplifier, maintaining said level at the value higher than the rest value of said detector for a period of time during which a negative feedback loop operates and subsequently raising said level of the reference signal smoothly.

14. The method according to claim 13, wherein a waveform of said reference signal which is smoothly raised is a cosine square waveform.

15. A power amplifying method comprising the steps of:

detecting an envelope level of an output of a variable gain power amplifier using a detector;

generating a reference signal to convert the envelope level of the output of said variable gain power amplifier to a smooth waveform using a reference signal generator;

comparing the envelope level of the output of said variable gain power amplifier detected by said detector with a waveform of the reference signal from said reference signal generator, thereby controlling a gain of said variable gain power amplifier in accordance with a comparison output; and smoothly reducing a level of the reference signal from said reference signal generator to a value near a rest value of said detector at a trailing edge of a transmission output from said variable gain power amplifier, maintaining said level at the value near the rest value of said detector for a period of time during which a negative feedback loop operates and subsequently reducing said level of the reference signal to the rest value of said detector or less.

16. The method according to claim 15, wherein a waveform of said reference signal which is smoothly reduced is a cosine square waveform.

17. A power amplifying circuit comprising:

a variable gain power amplifier receiving a transmission signal and producing a transmission output;

a detector for detecting an envelope level of an output of said variable gain power amplifier;

a reference signal generator for generating a reference signal to convert the envelope level of the output of said variable gain power amplifier to a smooth waveform; and a negative feedback loop including means for comparing the envelope level of the output of said variable gain power amplifier detected by said detector with a waveform of the reference signal from said reference signal generator, thereby producing a control signal for controlling a gain of said variable gain power amplifier in accordance with a comparison output, wherein a level of the reference signal from said reference signal generator is raised from a value lower than a rest value of said detector to a value higher than said rest value of said detector at a leading edge of the transmission output and is maintained at the value higher than the rest value of said detector and subsequently said level of the reference signal is smoothly raised from the start of the operation of said negative feedback loop.

18. The circuit according to claim 17, wherein a waveform of said reference signal which is smoothly raised is a cosine square waveform.

19. A power amplifying method comprising the steps of:

detecting an envelope level of an output of a variable gain power amplifier using a detector;

generating a reference signal to convert the envelope level of the output of said variable gain power amplifier to a smooth waveform using a reference signal generator;

comparing the envelope level of the output of said variable gain power amplifier detected by said detector with a waveform of the reference signal from said reference signal generator, thereby controlling a gain of said variable gain power amplifier in accordance with a comparison output; and raising a level of the reference signal from said reference signal generator from a value lower than a rest value of said detector to a value higher than the rest value of said detector at a leading edge of a transmission output from said variable gain power amplifier, maintaining said level at the value higher than the rest value of said detector and subsequently smoothly raising said level of the reference signal from the start of the operation of a negative feedback loop.

20. The method according to claim 19, wherein a waveform of said reference signal which is smoothly raised is a cosine square waveform.

* * * * *